United States Patent
Evans et al.

(10) Patent No.: US 7,551,512 B2
(45) Date of Patent: Jun. 23, 2009

(54) DUAL-PORT MEMORY

(75) Inventors: Donald Albert Evans, Lancaster, OH (US); Ross A. Kohler, Allentown, PA (US); Richard J. McPartland, Nazareth, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 219 days.

(21) Appl. No.: 11/830,417

(22) Filed: Jul. 30, 2007

(65) Prior Publication Data

US 2009/0034356 A1    Feb. 5, 2009

(51) Int. Cl.
*G11C 8/00*    (2006.01)
(52) U.S. Cl. ............... 365/230.05; 365/63; 365/230.02; 365/189.02
(58) Field of Classification Search ............ 365/230.05, 365/230.02, 63, 189.02
See application file for complete search history.

(56) References Cited

U.S. PATENT DOCUMENTS

| 6,661,733 | B1 * | 12/2003 | Pan et al. ............... 365/230.05 |
| 6,992,947 | B1 * | 1/2006 | Pan et al. ............... 365/230.05 |
| 2007/0109884 | A1 | 5/2007 | Jung | |

* cited by examiner

*Primary Examiner*—Son Dinh
(74) *Attorney, Agent, or Firm*—Ryan, Mason & Lewis, LLP

(57) ABSTRACT

A dual-port memory circuit includes a plurality of memory sub-blocks. Each of the memory sub-blocks includes a plurality of single-port memory cells, at least one row line, and at least one local bit line, the row line and the bit line being coupled to the memory cells for selectively accessing the memory cells. The memory circuit further includes at least one global bit line connected to the plurality of memory sub-blocks. The global bit line is time-multiplexed during a given memory cycle such that the global bit line propagates data associated with a first port in the memory circuit during a first portion of the memory cycle, and the global bit line propagates data associated with a second port in the memory circuit during a second portion of the memory cycle.

20 Claims, 5 Drawing Sheets

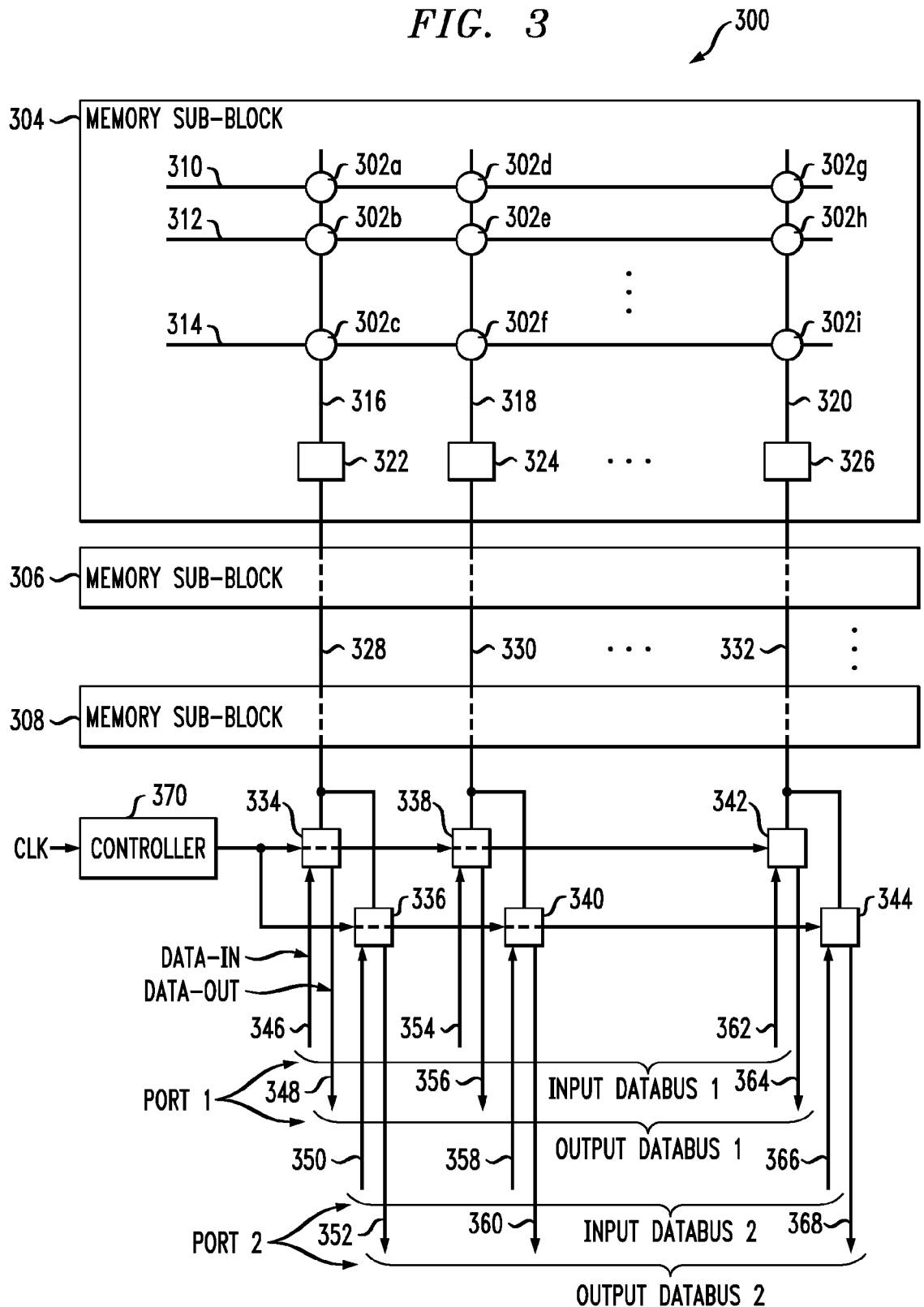

DUAL-PORT MEMORY

FIELD OF THE INVENTION

The present invention relates generally to electronic circuits, and more particularly relates to memory circuits.

BACKGROUND OF THE INVENTION

A memory system is typically triggered by an external clock signal. In general, during each cycle of the clock signal a memory system operation is completed, such as, for example, a read, a write or a NOOP (no-operation cycle, during which the memory remains idle). Clock cycles usually occur continuously and sequentially. Two well-known types of memory are single-port memory (SPM) and dual-port memory (DPM).

A SPM array may employ separate input and output data buses. The combination of independent input and output data buses is commonly referred to as a port. Each data bus (input and output) typically includes one line for each bit in a data word of the memory; the number of lines in the data buses is thus a function of a word size of the memory array. For a write operation, during each memory cycle a data word presented to the input data bus may be written into a selected memory location addressed within the memory array. For a read operation, during each memory cycle a data word may be read from a selected memory location addressed within the memory array and presented to the output bus. In the case of a NOOP, a memory cycle may be executed without instructing the memory to perform a read or a write operation. In alternative memory arrangements, a single common input/output (I/O) data bus may be used both to present data to the memory for writing and to retrieve data from the memory when reading. The common I/O data bus is also commonly referred to as a port. A SPM array, by definition, has one port.

A DPM array is characterized by having two access ports to the memory array; that is, it has two sets of input data buses and two sets of output data buses, or alternately, two common I/O data buses. Each set of input and output data buses, or each single I/O data bus, is commonly referred to as a port. Each port may access memory cells in the array through separate memory cell paths, or access the memory cells through the same memory cell path but with only one port accessing the memory cell during any given memory cycle.

Dual-port memory arrays traditionally offer a higher data throughput compared to single-port memory arrays since two memory accesses can be performed in a single clock cycle in a dual-port memory array. However, in order to implement a dual-port memory architecture, each memory cell in the dual-port memory array requires additional transistors. For example, one conventional dual-port memory cell includes eight transistors; four of the transistors are interconnected to form two cross-coupled inverters functioning as a primary storage element in the cell and the remaining transistors are connected to form two access paths in the cell. By comparison, a single-port memory cell typically requires six transistors; four of the transistors are interconnected to form two cross-coupled inverters functioning as a primary storage element in the cell (as in the dual-port memory cell) and the remaining transistors are connected to form a single access path in the cell. The six-transistor single-port memory cell typically consumes about half as much integrated circuit area as the eight-transistor dual-port memory cell, and is therefore preferred.

Accordingly, there exists a need for an improved memory architecture capable of providing the advantages of dual-port access but which does not suffer from one or more of the above-noted problems exhibited by conventional dual-port memory architectures.

SUMMARY OF THE INVENTION

The present invention meets the above-noted need by providing, in illustrative embodiments thereof, a memory circuit having dual-port functionality and that is substantially as small as a single-port memory circuit. Furthermore, the memory circuit according to embodiments of the invention includes at least two access ports and has the ability to have both ports operate at substantially the same memory cycle time as a single-port memory.

In accordance with an embodiment of the invention, a dual-port memory circuit includes a plurality of memory sub-blocks. Each of the memory sub-blocks includes a plurality of single-port memory cells, at least one row line, and at least one local bit line, the row line and the bit line being coupled to the memory cells for selectively accessing the memory cells. The memory circuit further includes at least one global bit line connected to the plurality of memory sub-blocks. The global bit line is time-multiplexed during a given memory cycle such that the global bit line propagates data associated with a first port in the memory circuit during a first portion of the memory cycle, and the global bit line propagates data associated with a second port in the memory circuit during a second portion of the memory cycle.

In accordance with another aspect of the invention, a method of providing, in a given memory cycle, dual-port access in a memory circuit, the memory circuit including a plurality of memory sub-blocks including a plurality of single-port memory cells and including at least one global bit line connected to the plurality of memory sub-blocks, includes the step of time-multiplexing the global bit line during the given memory cycle such that the global bit line propagates data associated with a first port in the memory circuit during a first portion of the memory cycle, and the global bit line propagates data associated with a second port in the memory circuit during a second portion of the memory cycle.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 3 is a schematic diagram depicting at least a portion of an exemplary memory circuit, formed in accordance with an embodiment of the present invention.

DETAILED DESCRIPTION OF THE INVENTION

The present invention will be described herein in the context of illustrative dual-port memory circuits. It should be understood, however, that the present invention is not limited to these or any other particular circuit arrangements. Rather, the invention is more generally applicable to techniques for providing a memory circuit having dual-port functionality using single-port memory cells. Since single-port memory cells are employed, illustrative embodiments of the invention advantageously reduce the integrated circuit area required to implement the memory circuit. Moreover, memory circuits formed in accordance with illustrative embodiments of the invention are adapted to operate at substantially the same memory cycle time as a single-port memory architecture.

Although implementations of the present invention described herein may be implemented using p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
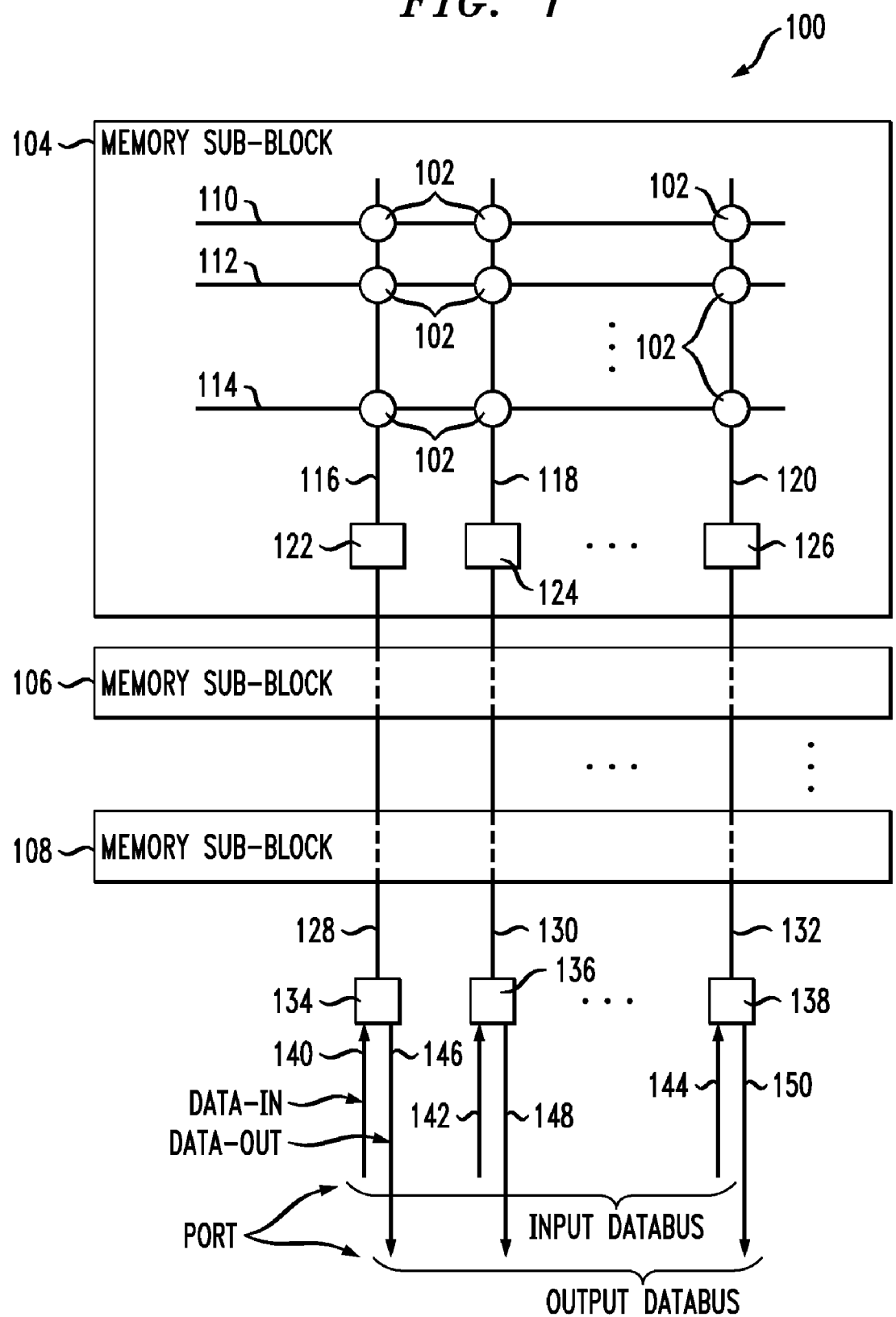
FIG. 1 is a schematic diagram depicting at least a portion of an illustrative memory circuit, in which techniques of the present invention may be implemented.

FIG. 1 is a schematic diagram depicting at least a portion of an illustrative memory circuit 100, in which techniques of the present invention may be implemented. Memory circuit 100 includes a plurality of single-port memory cells 102, which may be referred to herein as bit-cells, segregated into one or more memory sub-blocks 104, 106 and 108. The invention is not limited to any specific number of memory sub-blocks, nor is it limited to any specific number of memory cells in each memory sub-block. Each memory sub-block preferably comprises a plurality of row lines, 110, 112 and 114, with associated row decoders and row drivers (not shown), and a plurality of local bit lines (LBLs), 116, 118 and 120. Each memory cell 102 is preferably connected at an intersection of a row line and a local bit line. Each of the memory sub-blocks 104, 106, 108 further includes a number of local sense amplifiers (LSAs) 122, 124 and 126, each associated with a corresponding local bit line 116, 118 and 120, respectively. Certain functional components which are conventionally used in a memory circuit, such as, for example, address decoders, column multiplexers, etc., are purposefully not described herein for economy of description. However one skilled in the art will readily recognize those components omitted from these generalized descriptions.

The arrangement of the row lines 110, 112, 114 in a substantially horizontal direction and the arrangement of the local bit lines 116, 118, 120 in a substantially vertical direction (e.g., orthogonal to the row lines) is essentially arbitrary, and it is to be appreciated that alternative arrangements of row lines and/or bit lines in the memory circuit 100 are contemplated (e.g., diagonal). Moreover, it is to be understood that the invention is not limited to any particular number of memory cells within a memory sub-block, nor is the invention limited to any particular number or arrangement of row lines and local bit lines in the memory sub-block. The memory sub-blocks 104, 106, 108 are not required to have the same number and/or arrangement of memory cells relative to one another.

Memory circuit 100 further includes a plurality of global bit lines (GBLs) 128, 130 and 132, and a plurality of global sense amplifiers (GSAs) 134, 136 and 138, each of the global sense amplifiers 134, 136, 138 being connected to a corresponding global bit line 128, 130, 132, respectively. The plurality of local sense amplifiers in the respective memory sub-blocks are preferably connected to a corresponding global sense amplifier via a corresponding global bit line. For example, local sense amplifier 122 in memory sub-block 104 is connected to global sense amplifier 134 via global bit line 128. Likewise, local sense amplifier 124 in memory sub-block 104 is connected to global sense amplifier 136 via global bit line 130, and local sense amplifier 126 in memory sub-block 104 is connected to global sense amplifier 138 via global bit line 132. Data to be written into one or more selected memory cells 102 is preferably supplied to one or more global sense amplifiers 134, 136 and 138 corresponding to the selected memory cells via one or more input data lines 140, 142 and 144, respectively. The input data lines 140, 142, 144 collectively form an input data bus. Likewise, data read from one or more selected memory cells 102 is preferably accessed through one or more global sense amplifiers 134, 136 and 138 corresponding to the selected memory cells via one or more output data lines 146, 148 and 150, respectively. The output data lines 146, 148, 150 collectively form an output data bus. As previously stated, the combination of independent input and output data buses is commonly referred to as a port.

Typically, memories are accessed to read or write groups of cells at one time. A group of memory cells is often termed a "word." A word generally represents a logical group of cells that are written or read together as one addressed unit. The address supplied to the memory is indicative of the word to be written or read. Word lengths are typically grouped in multiples of 8 memory cells, such as, for example, 8, 16, 32, and multiples of 32 memory cells, although the invention is not limited to any particular memory word size. However, some memories perform write or read operations on a memory cell-by-memory cell basis (e.g., a single memory cell at a time). These memories have a word length of one. For this case, the address is representative of a single memory cell. For the purposes of this invention, a word may comprise one or more memory cells.

Figure 2A:
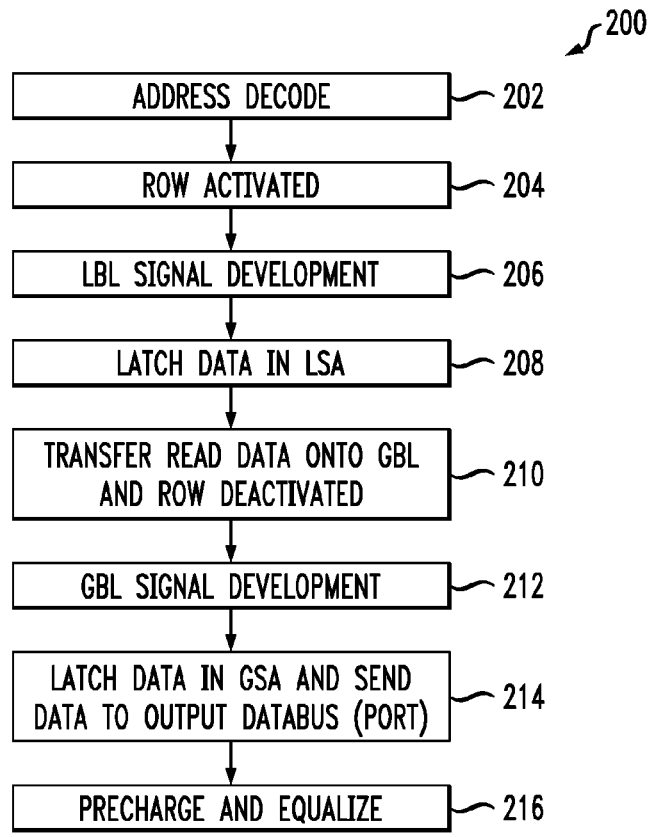
FIG. 2A depicts an illustrative methodology for reading a logical state of one or more memory cells in the memory circuit shown in FIG. 1.

FIG. 2A depicts an illustrative methodology 200 for reading a logical state of one or more memory cells in memory circuit 100 shown in FIG. 1. For a read operation, an address is first decoded, in step 202, to determine from which intended word, data is to be read. The row line corresponding to the intended memory word to be read is activated in step 204. When a given row line is activated, all memory cells associated with the given row line are coupled to their respective local bit lines causing the states of the memory cells to be transferred onto the local bit lines in step 206. These states, or local bit line signals, are then detected, amplified and latched, in step 208, by the local sense amplifiers connected to the respective local bit lines before being transferred onto associated global bit lines in step 210. The row line is then deactivated in step 210. Signals developed on the global bit lines in step 212 are detected, amplified and latched by the respective global sense amplifiers connected thereto before being forwarded to the output data bus in step 214. The local and global bit lines are then precharged and equalized in step 216. Note, that multiple memory sub-blocks may be arranged along a group of global bit lines. However, during any given memory cycle, only one row line is active and only in one selected memory sub-block, that is, only one row line is active along an entire set of global bit lines.

Figure 2B:
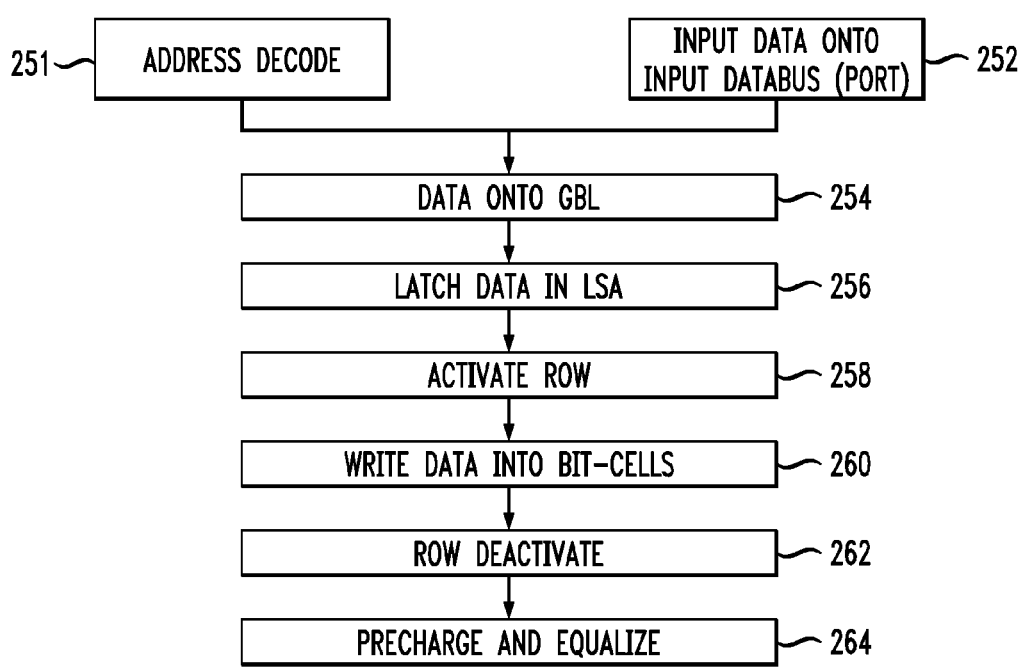
FIG. 2B depicts an illustrative methodology for writing a logical state of one or more memory cells in the memory circuit shown in FIG. 1.

FIG. 2B depicts an illustrative methodology 250 for writing a logical state of one or more memory cells in memory circuit 100 shown in FIG. 1. For a write operation, data to be written into one or more intended memory cells is placed on the input data bus in step 252. At substantially the same time, the address of the word to be written is decoded in step 251. This input data is then transferred onto one or more corresponding global bit lines either directly or through the corresponding global sense amplifiers in step 254. In step 256, the input data is latched in the local sense amplifiers coupled to the respective global bit lines. While the input data propagates towards the memory cells, a selected row line in a selected memory sub-block containing the memory cells to be written is activated in step 258, thereby coupling the memory cells to their respective local bit lines for receiving the input data, thereby writing the input data into the intended memory cells in step 260. The row line is deactivated in step 262 and then the local and global bit lines are precharged and equalized in step 264.

An advantage of single-port memory cells 102, as utilized, for example, in illustrative memory circuit 100 shown in FIG. 1, is that they are significantly smaller compared to dual-port memory cells employed in a conventional dual-port memory, thereby resulting in a reduction in the required integrated circuit area. However, a dual-port memory, because it allows two memory accesses per memory cycle (one access from each port), has a higher data rate compared to a single-port memory. As previously stated, a dual-port memory, as the term is used herein, refers to a memory architecture having two access ports, wherein each port has read and write capabilities, but during any given memory cycle only one port may be used for writing and one port may be used for reading. There is a further restriction that the memory cells and the corresponding local sense amplifiers associated with the read and write operations reside in different memory sub-blocks, as will be described in further detail below.

Dual-port memory arrays offer a higher data throughput compared to single-port memory arrays since two memory accesses can be performed in a single memory cycle in a dual-port memory array. FIG. 3 is a schematic diagram depicting at least a portion of a dual-port memory circuit 300, formed in accordance with an embodiment of the invention. Memory circuit 300 includes a plurality of single-port memory cells 302a, 302b, 302c, 302d, 302e, 302f, 302g, 302h and 302i, which may be referred to collectively as 302. Memory cells 302 are segregated into two or more memory sub-blocks 304, 306 and 308. The invention is not limited to any specific number of memory sub-blocks, nor is it limited to any specific number or arrangement of memory cells in each memory sub-block. Each memory sub-block, of which memory sub-block 304 is representative, preferably includes a plurality of row lines, 310, 312 and 314, with associated row decoders and row drivers (not shown), and a plurality of local bit lines (LBLs), 316, 318 and 320. Each of the memory cells 302 is preferably connected at an intersection of a row line and a local bit line. Each of the memory sub-blocks 304, 306, 308 further includes a number of local sense amplifiers (LSA) 322, 324 and 326, each local sense amplifier associated with a corresponding local bit line 316, 318 and 320, respectively.

As stated above with regard to FIG. 1, certain functional components which are conventionally used in a memory circuit, such as, for example, address decoders, column multiplexers, etc., are purposefully not described herein for economy of description. However one skilled in the art will readily recognize those components omitted from these generalized descriptions.

Memory circuit 300 further includes a plurality of global bit lines (GBLs) 328, 330 and 332, and a plurality of global sense amplifiers (GSAs) 334, 336, 338, 340, 342 and 344, coupled to the global bit lines. A first set of global sense amplifiers, namely, 334, 338 and 342, preferably corresponds to a first port (Port 1) of the memory circuit 300, and a second set of global sense amplifiers, namely, 336, 340 and 344, corresponds to a second port (Port 2) of the memory circuit. Each global bit line is preferably connected to a corresponding pair of global sense amplifiers. Specifically, global bit line 328 is preferably connected to global sense amplifiers 334 and 336, global bit line 330 is connected to global sense amplifiers 338 and 340, and global bit line 332 is connected to global sense amplifiers 342 and 344. The plurality of local sense amplifiers in the respective memory sub-blocks are preferably connected to a corresponding pair of global sense amplifiers via a corresponding global bit line. For example, local sense amplifier 322 in memory sub-block 304 is connected to global sense amplifiers 334 and 336 via global bit line 328, local sense amplifier 324 is connected to global sense amplifiers 338 and 340 via global bit line 330, and local sense amplifier 326 is connected to global sense amplifiers 342 and 344 via global bit line 332.

Data to be written into one or more selected memory cells 302 is preferably supplied to one or more global sense amplifiers 334, 336, 338, 340, 342, 344 via corresponding input data lines. Specifically, data is supplied to global sense amplifier 334 by input data line 346, data is supplied to global sense amplifier 336 by input data line 350, data is supplied to global sense amplifier 338 by input data line 354, data is supplied to global sense amplifier 340 by input data line 358, data is supplied to global sense amplifier 342 by input data line 362, and data is supplied to global sense amplifier 342 by input data line 366. Input data lines 346, 354 and 362 associated with the first set of global sense amplifiers 334, 338 and 342, respectively, collectively form a first input data bus (Input Databus 1). Input data lines 350, 358 and 366 associated with the second set of global sense amplifiers 336, 340 and 344, respectively, collectively form a second input data bus (Input Databus 2).

Likewise, data read from one or more selected memory cells 302 is preferably accessed through one or more global sense amplifiers 334, 336, 338, 340, 342, 344 via one or more corresponding output data lines. Specifically, data is read from global sense amplifier 334 by output data line 348, data is read from global sense amplifier 336 by output data line 352, data is read from global sense amplifier 338 by output data line 356, data is read from global sense amplifier 340 by output data line 360, data is read from global sense amplifier 342 by output data line 364, and data is read from global sense amplifier 342 by output data line 368. Output data lines 348, 356 and 364 associated with the first set of global sense amplifiers 334, 338 and 342, respectively, collectively form a first output data bus (Output Databus 1). Output data lines 352, 360 and 368 associated with the second set of global sense amplifiers 336, 340 and 344, respectively, collectively form a second output data bus (Output Databus 2). Port 1 includes the combination of the first input and output data buses, and Port 2 includes the combination of the second input and output data buses.

In order to increase the data rate per memory cycle, memory circuit 300 beneficially performs a time-multiplexing of the global bit lines during a given memory cycle such that one or more global bit lines propagate data associated with the first port during a first portion of the memory cycle and propagate data associated with the second port during a second portion of the memory cycle. Time-multiplexing the global bit lines allows for a single cycle access from both ports to the memory circuit, thereby enabling a dual-port memory architecture to be implemented using memory cells that are substantially the same, at least in terms of functionality and size, as a memory cell employed in a standard single-port memory. Moreover, this exemplary memory architecture achieves simultaneous data rates for both ports (e.g., Port 1 and Port 2) that are substantially the same as the port data rate in a standard single-port memory circuit.

To accomplish this, memory circuit 300 preferably includes a controller 370, or alternative control circuitry, operative to receive a clock signal, CLK, and to generate one or more control signals for selectively activating either the first or second set of global sense amplifiers corresponding to the respective global bit lines during a given portion of the memory cycle. Both ports have access to the global bit lines during different portions of the memory cycle. More particularly, two memory sub-blocks will access one or more respective memory cells therein within the same memory cycle, but at different times during the memory cycle. Thus, during a given memory cycle, a set of global bit lines may read selected memory cells, or word, in one memory sub-block, and a set of global bit lines may write selected memory cells, or word, in another memory sub-block. Each of these two memory sub-blocks will be associated with one of the two ports.

The number of global bit lines within a given set is the same as the number of memory cells, or word length, being written into or read from the corresponding memory sub-block. The two sets of global bit lines, one associated with a read from one memory sub-block and one associated with a write into another memory sub-block, may or may not contain the same global bit lines. For example, the two sets of global bit lines may contain all the same global bit lines, they may contain none of the same global bit lines, or they may contain some subset of the same global bit lines. The number of memory cells being read and the number of cells being written, and thus their number of corresponding global bit lines) may be the same or may be different in number.

Figure 4:
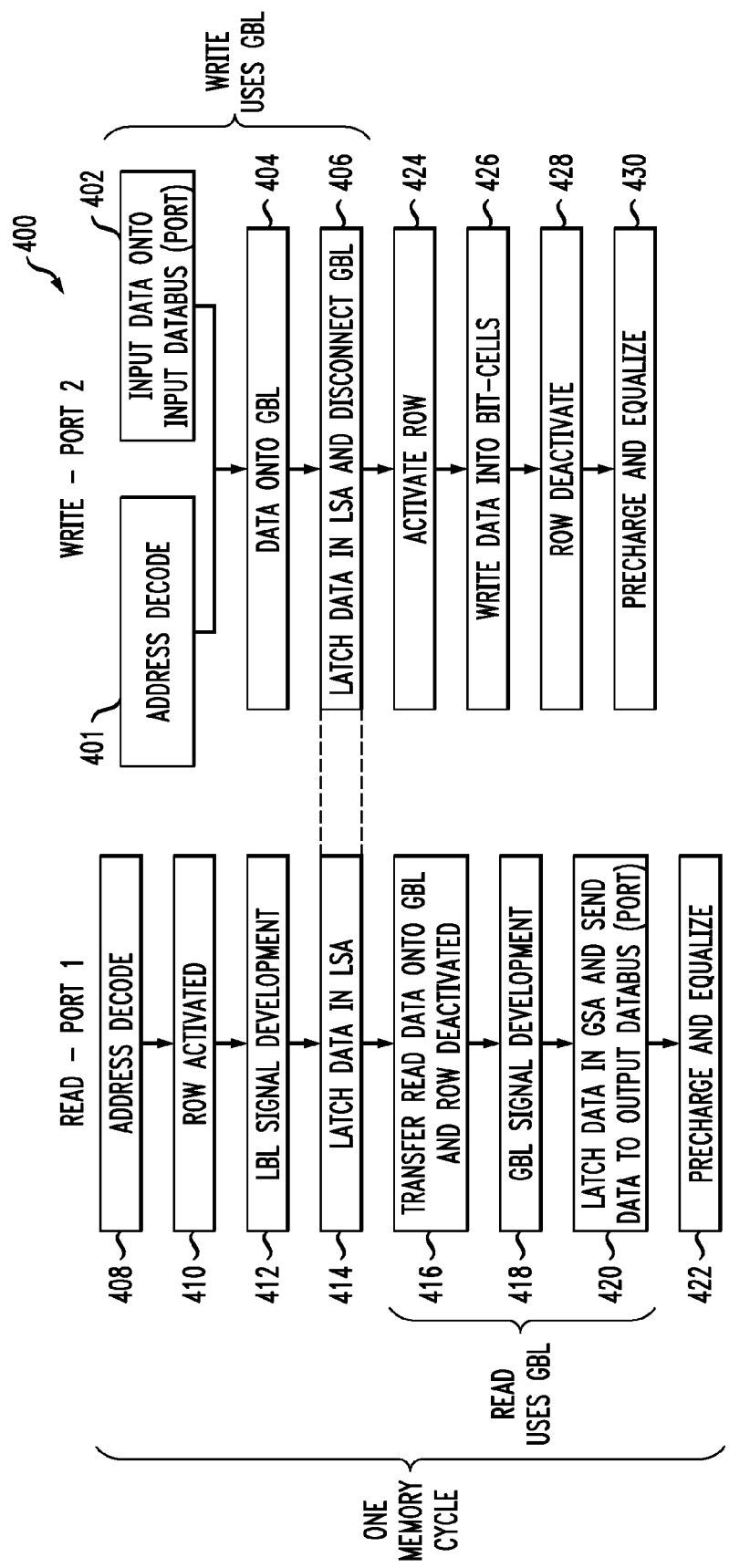
FIG. 4 depicts at least a portion of an exemplary methodology for reading from one port and writing to another port during a given memory cycle, in accordance with an embodiment of the invention.

FIG. 4 depicts at least a portion of an exemplary methodology 400 for reading from one port and writing to another port during a given memory cycle, in accordance with an embodiment of the invention. In this example, port 1 is used as a read port and port 2 is used as a write port, although such port assignments are purely arbitrary. Port 2 has first access to the global bit lines. In steps 401 and 402 of method 400, after, or at substantially the same time as, performing an address decode, data is presented onto the input data bus associated with port 2 (Input Databus 2). In step 404, this input data is placed on at least one global bit line corresponding to at least one selected memory cell, the selected memory word, through at least one corresponding global sense amplifier connected to the global bit lines. In step 406, the input data is latched in the corresponding local sense amplifiers connected to the global bit lines. Once the data to be written is latched, the local sense amplifiers are disconnected from the corresponding global bit lines, thereby freeing up the global bit lines for access associated with reading data from port 1.

Concurrently, while the portion of the write operation performed in steps 401, 402, 404 and 406 is occurring, the read operation associated with port 1 preferably transfers data from one or more selected memory cells, the selected memory word, in the memory circuit onto one or more corresponding local bit lines and latching this data into one or more corresponding local sense amplifiers connected to the local bit lines. Specifically, in step 408 an address is first decoded to determine which selected memory word and corresponding memory sub-block in the memory circuit is to be accessed (e.g., data read from). In step 410, the row line to which the selected memory word is connected is activated. Once the row line is activated, signals indicative of the logic states of the selected memory word are developed on the corresponding local bit lines in step 412. In step 414, data conveyed on the local bit lines are latched in the corresponding local sense amplifiers connected to the local bit lines. At this point, the read operation waits until the global bit lines are available to transfer the data latched in the local sense amplifiers onto the global bit lines and then to the output data bus associated with port 1.

Once the global bit lines have been freed up from the local sense amplifiers associated with the write operation of port 2, the local sense amplifiers associated with the read operation of port 1 can be connected onto the global bit lines for transferring the data latched in the local sense amplifier to the corresponding global bit line in step 416. The row line corresponding to the selected memory word is also deactivated in step 416. In step 418, signals indicative of the data read from the selected memory word and latched in local sense amplifiers is developed on the corresponding global bit lines connected thereto. In step 420, data conveyed on the global bit fines is latched in the corresponding global sense amplifiers connected to the global bit lines and then sent to the output bus corresponding to port 1 (Output Databus 1). A precharge and equalization procedure is then preferably performed in step 422 to prepare the local bit lines and global bit lines for the next read and write access.

Concurrently during the latter portion of the read operation associated with port 1, while the read operation has access to the global bit lines (e.g., steps 416, 418 and 420), the write operation associated with port 2 completes by transferring data from the local sense amplifiers into the selected memory word. More particularly, the write operation continues at step 424 where the row line corresponding to the selected memory word is activated. Once the appropriate row line is activated, the data latched in the local sense amplifiers is written into the selected memory word in step 426. In step 428, the row line is deactivated. A precharge and equalization procedure is then preferably performed in step 430 to prepare the local bit lines and global bit lines for the next read and write access.

Figure 5:
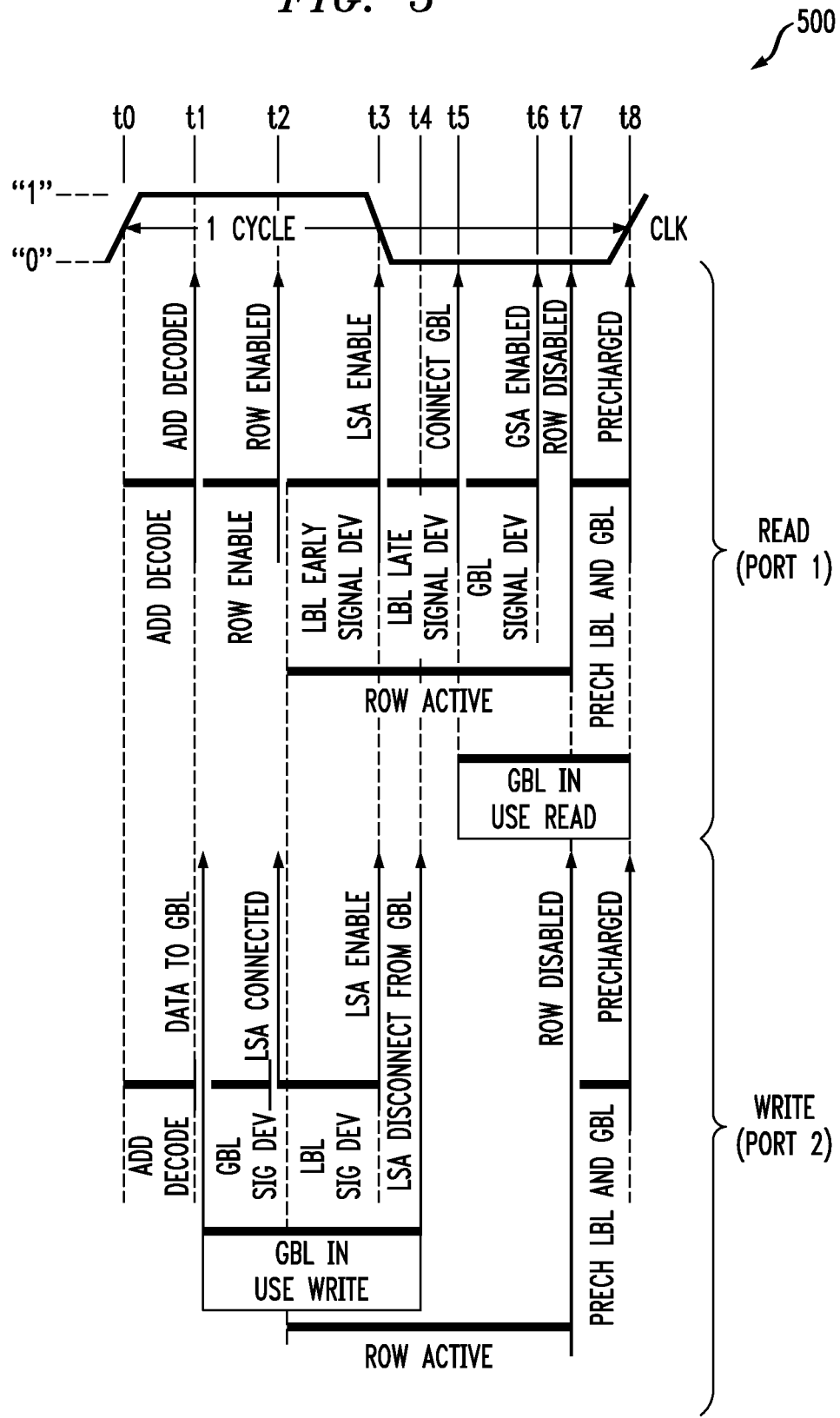
FIG. 5 is a diagram depicting exemplary timing sequences for performing the read and write operations shown in FIG. 4, in accordance with an embodiment of the present invention.

FIG. 5 is a logic timing diagram 500 depicting exemplary timing sequences for performing the methodology 400 shown in FIG. 4, in accordance with an embodiment of the present invention. Specifically, diagram 500 shows illustrative timing sequences for both the read operation and the write operation of a dual-port access for the dual-port memory circuit. The memory cycle begins a time t0 and ends at time t8. It is to be appreciated that the time intervals shown may not be drawn to scale. It is also to be appreciated that, in this illustrative example, the placement of the falling edge of the memory clock CLK is essentially of no significance, but has been arbitrarily placed approximately midway through the cycle. It is not necessarily directly associated with the timing of events within the memory. At time t0, triggered by a rising edge of memory clock CLK (e.g., clock signal transitioning from a logic "0" to a logic "1" state), an address decode is performed in connection with both the read (port 1) and write (port 2) operations. At time t1, access to the global bit lines is provided for the write operation. A signal indicative of data presented to the input data bus associated with port 2 (via the global sense amplifiers) is developed on the global bit lines. Concurrently, as part of the read operation, the row line corresponding to the decoded address is enabled (e.g., activated). At time t2, the local sense amplifiers used for the write operation are connected to the global bit lines. The row line corresponding to the memory word to be written is also enabled. Concurrently, as part of the read operation, with the row line activated, signals indicative of data from the respective memory word connected to the row line is developed on corresponding local bit lines. At time t3, data on the global bit lines is latched into the corresponding local sense amplifiers associated with the write operation. Concurrently, data on the local bit lines is latched into the corresponding local sense amplifiers associated with the read operation.

At time t4, the local sense amplifiers used during the write operation are disconnected from the global bit lines, thereby freeing up the global bit lines for use during the latter portion of the read operation. With regard to the read operation, late signal development completes on the local bit lines. At time t5, the local sense amplifiers associated with the read operation are connected to the corresponding global bit lines and a signal indicative of the data read from the selected memory word and latched in the local sense amplifiers is developed on the global bit lines. At time t6, the global sense amplifiers are activated to latch the data read from the memory word. Once the data is latched in the global sense amplifiers, the row line used during the read operation is disabled at time t7 and the data is presented to the output data bus associated with the port 1. Concurrently, the row line used during the write operation is disabled. The local bit lines and global bit lines are also precharged at time t7 for the next read and write access during a subsequent memory cycle which begins at time t8.

In this example, the timings of certain events have been made the same for both the read and write operations, although other timing configurations are contemplated by the invention (e.g., read and write operations with unequal time partitions). In particular, the time that the row line is active, the time that the local sense amplifiers are enabled, and the time that the local and global sense amplifiers and local and global bit lines are precharged and equalized is the same for both the read and write operations. This provides a less complex design, but one in which the global bit line dead time, which may be defined as the time between when the write and read operations have access to the global bit lines, may not be optimized. As apparent from the figure, the portion of the memory cycle during which the global bit lines are used by the write operation (e.g., t1-t4) does not overlap the portion of the memory cycle during which the global bit lines are used by the read operation (e.g., t5-t8). This confirms that the global bit lines can be time-multiplexed between read and write operations to enable the high-performance and small, thus cost effective, dual-port memory access using single-port memory cells.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in any application and/or electronic system which uses embedded memory. Suitable systems for implementing techniques of the invention may include, but are not limited, to personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A dual-port memory circuit, comprising:
a plurality of memory sub-blocks, each of the memory sub-blocks including a plurality of single-port memory cells, at least one row line, and at least one local bit line, the at least one row line and the at least one bit line being coupled to the memory cells for selectively accessing the memory cells;
at least one global bit line connected to the plurality of memory sub-blocks, the at least one global bit line being time-multiplexed during a given memory cycle such that the at least one global bit line propagates data associated with a first port in the memory circuit during a first portion of the memory cycle, and the at least one global bit line propagates data associated with a second port in the memory circuit during a second portion of the memory cycle.

2. The memory circuit of claim 1, wherein the at least one global bit line is adapted to supply, from the first port, data to be written to at least one selected memory cell in a first one of the memory sub-blocks during the first portion of the memory cycle and to present, to the second port, data read from at least one selected memory cell in a second one of the memory sub-blocks during the second portion of the memory cycle as a function of at least one control signal supplied to the memory circuit.

3. The memory circuit of claim 1, further comprising a controller operative to receive a clock signal, to which the memory cycle is referenced, and to generate at least one control signal based at least in part on the clock signal, the time multiplexing of the at least one global bit line being selectively controlled as a function of at least one control signal.

4. The memory circuit of claim 3, wherein the controller is operative to control the time multiplexing such an amount of time that the at least one global bit is used by the first port is substantially equal to an amount of time that the at least one global bit is used by the second port.

5. The memory circuit of claim 1, further comprising at least one pair of global sense amplifiers connected to the at least one global bit line, a first of the pair of global sense amplifiers including a data input line and a data output line associated with the first port in the memory circuit, and a second of the pair of global sense amplifiers including a data input line and a data output line associated with the second port in the memory circuit.

6. The memory circuit of claim 5, wherein the data input line and data output line corresponding to at least one of the global sense amplifiers is combined to form a single data input/output line.

7. The memory circuit of claim 5, wherein the data input line and data output line corresponding to at least one of the global sense amplifiers are separate from one another.

8. The memory circuit of claim 1, wherein each of the plurality of memory sub-blocks comprises at least one local sense amplifier connected to the corresponding at least one local bit line and to the corresponding at least one global bit line.

9. The memory circuit of claim 1, further comprising:
a plurality of global bit lines connected to the plurality of memory sub-blocks; and
a plurality of pairs of global sense amplifiers, each pair of global sense amplifiers being connected to a corresponding one of the global bit lines, a first subset of the global sense amplifiers being associated with the first port and a second subset of the global sense amplifiers being associated with the second port.

10. A method of providing, in a given memory cycle, dual-port access in a memory circuit, the memory circuit including a plurality of memory sub-blocks including a plurality of single-port memory cells and including at least one global bit line connected to the plurality of memory sub-blocks, the method comprising the step of:
time-multiplexing the at least one global bit line during the given memory cycle such that the at least one global bit line propagates data associated with a first port in the memory circuit during a first portion of the memory cycle, and the at least one global bit line propagates data associated with a second port in the memory circuit during a second portion of the memory cycle.

11. The method of claim 10, further comprising the steps of:
supplying, from the first port, data to be written to at least one selected memory cell in a first one of the memory sub-blocks during the first portion of the memory cycle; and
presenting, to the second port, data read from at least one selected memory cell in a second one of the memory sub-blocks during the second portion of the memory cycle as a function of at least one control signal supplied to the memory circuit.

12. The method of claim 10, further comprising the steps of:
generating at least one control signal based at least in part on a received clock signal to which the memory cycle is referenced; and
selectively controlling the time-multiplexing of the at least one global bit line as a function of the at least one control signal.

13. The method of claim 10, wherein the step of time-multiplexing the at least one global bit line comprises controlling an amount of time during which the at least one global bit is used by each of the first and second ports such that an amount of time that the at least one global bit is used by the first port is substantially equal to an amount of time that the at least one global bit is used by the second port.

14. The method of claim 10, further comprising the steps of:
reading a logic state of at least one memory cell in a first one of the memory sub-blocks via the first port during the first portion of the memory cycle; and
writing a logic state of at least one memory cell in a second one of the memory sub-blocks via the second port during the second portion of the memory cycle.

15. The method of claim 14, wherein the step of reading comprises the steps of:
decoding an address presented to the memory circuit to determine a selected memory word and corresponding memory sub-block in the memory circuit to be read;
activating a row line to which the selected memory word is connected to thereby enable signals indicative of data read from the selected memory word to be developed on local bit lines corresponding to the selected memory word;
latching data conveyed on the local bit lines in corresponding local sense amplifiers connected to the local bit lines;
transferring data latched in the local sense amplifiers onto global bit lines connected to the local sense amplifiers and then deactivating the row line to which the selected memory word is connected;
latching data conveyed on the global bit lines in corresponding global sense amplifiers connected to the global bit lines after a prescribed amount of time during which signals indicative of data latched in the local sense amplifiers are developed on global bit lines; and
sending the data latched in the global sense amplifiers to an output data bus corresponding to the first port.

16. The method of claim 14, wherein the step of writing comprises the steps of:
decoding an address presented to the memory circuit to determine a selected memory word and corresponding memory sub-block in the memory circuit to be written;
presenting data to be written into the selected memory word onto an input data bus corresponding to the second port;
transferring, through global sense amplifiers coupled to the input data bus, the data to be written into the selected memory word onto global bit lines corresponding to the selected memory word;
latching the data conveyed on the global bit lines in corresponding local sense amplifiers connected to the global bit lines and then disconnecting the local sense amplifiers from the corresponding global bit lines; and
activating a row line to which the selected memory word is connected to thereby write the data latched in the corresponding local sense amplifiers to the selected memory word; and
deactivating the row line to which the selected memory word is connected once the data has been written to the selected memory word.

17. An integrated circuit including at least one embedded memory circuit, the at least one embedded memory circuit comprising:
a plurality of memory sub-blocks, each of the memory sub-blocks including a plurality of single-port memory cells, at least one row line, and at least one local bit line, the at least one row line and the at least one bit line being coupled to the memory cells for selectively accessing the memory cells;
at least one global bit line connected to the plurality of memory sub-blocks, the at least one global bit line being time-multiplexed during a given memory cycle such that the at least one global bit line propagates data associated with a first port in the embedded memory circuit during a first portion of the memory cycle, and the at least one global bit line propagates data associated with a second port in the embedded memory circuit during a second portion of the memory cycle.

18. The integrated circuit of claim 17, wherein the at least one global bit line is adapted to supply, from the first port, data to be written to at least one selected memory cell in a first one of the memory sub-blocks during the first portion of the memory cycle and to present, to the second port, data read from at least one selected memory cell in a second one of the memory sub-blocks during the second portion of the memory cycle as a function of at least one control signal supplied to the at least one embedded memory circuit.

19. The integrated circuit of claim 17, wherein the at least one embedded memory circuit further comprises a controller operative to receive a clock signal, to which the memory cycle is referenced, and to generate at least one control signal based at least in part on the clock signal, the time multiplexing of the at least one global bit line being selectively controlled as a function of at least one control signal.

20. An electronic system, comprising:
 at least one integrated circuit including at least one embedded memory circuit, the at least one embedded memory circuit comprising:
  a plurality of memory sub-blocks, each of the memory sub-blocks including a plurality of single-port memory cells, at least one row line, and at least one local bit line, the at least one row line and the at least one bit line being coupled to the memory cells for selectively accessing the memory cells;
 at least one global bit line connected to the plurality of memory sub-blocks, the at least one global bit line being time-multiplexed during a given memory cycle such that the at least one global bit line propagates data associated with a first port in the embedded memory circuit during a first portion of the memory cycle, and the at least one global bit line propagates data associated with a second port in the embedded memory circuit during a second portion of the memory cycle.

* * * * *